US012656412B2

(12) United States Patent (10) Patent No.: US 12,656,412 B2
Zhao et al. (45) Date of Patent: Jun. 16, 2026

(54) SYSTEM, DEVICE AND METHOD FOR DETERMINING TEST RESULT BASED ON OUTPUT VOLTAGES OF USB INTERFACE

(71) Applicants: SQ Technology (Shanghai) Corporation, Shanghai (CN); Inventec Corporation, Taipei (TW)

(72) Inventors: Jin-Dong Zhao, Shanghai (CN); Tian-Chao Zhang, Shanghai (CN); Yuan Sang, Shanghai (CN)

(73) Assignees: SQ Technology (Shanghai) Corporation, Shanghai (CN); Inventec Corporation, Taipei City (TW)

( * ) Notice: Subject to any disclaimer, the term of this patent is extended or adjusted under 35 U.S.C. 154(b) by 182 days.

(21) Appl. No.: 18/592,328

(22) Filed: Feb. 29, 2024

(65) Prior Publication Data

US 2025/0189601 A1 Jun. 12, 2025

(30) Foreign Application Priority Data

Dec. 12, 2023 (CN) .......................... 202311704444.9

(51) Int. Cl.
*G01R 31/66* (2020.01)
(52) U.S. Cl.
CPC .................................... *G01R 31/66* (2020.01)

(58) Field of Classification Search
CPC ...................................................... G01R 31/66
See application file for complete search history.

(56) References Cited

U.S. PATENT DOCUMENTS

| | | | |
|---|---|---|---|
| 6,184,730 B1* | 2/2001 | Kwong | H03K 17/167 327/112 |
| 2007/0083692 A1* | 4/2007 | Liu | G06F 13/4072 710/304 |
| 2008/0170610 A1* | 7/2008 | Harper | G06F 11/24 375/226 |
| 2022/0252645 A1* | 8/2022 | Akdins | G08C 17/02 |

* cited by examiner

*Primary Examiner* — Akm Zakaria

(57) ABSTRACT

A system, a device, and a method for determining test result based on output voltages of USB interface are disclosed. In the system, a USB specification-compliant pull-up component is disposed in a test fixture, the test fixture is controlled whether to output a voltage signal to a USB interface of a device under test, or not output voltage signal, and then an output voltage corresponding to the USB interface is read, and a test result is generated based on the read output voltage, so that a USB interfaces of computing apparatus which does not support boundary scan can be tested without booting an operating system of the computing apparatus, and the effect of increasing testing efficiency can be achieved.

4 Claims, 3 Drawing Sheets

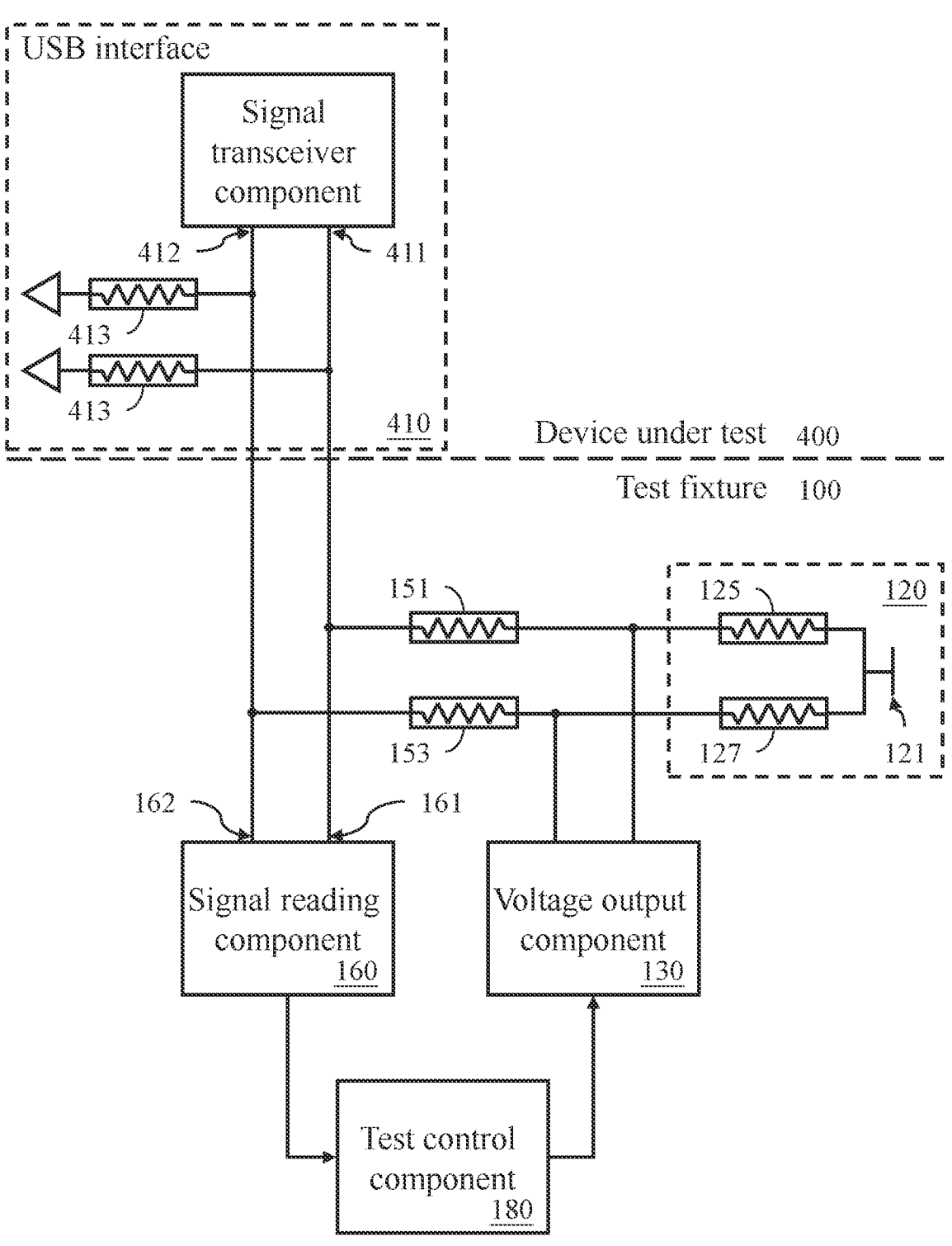
【Fig. 1】

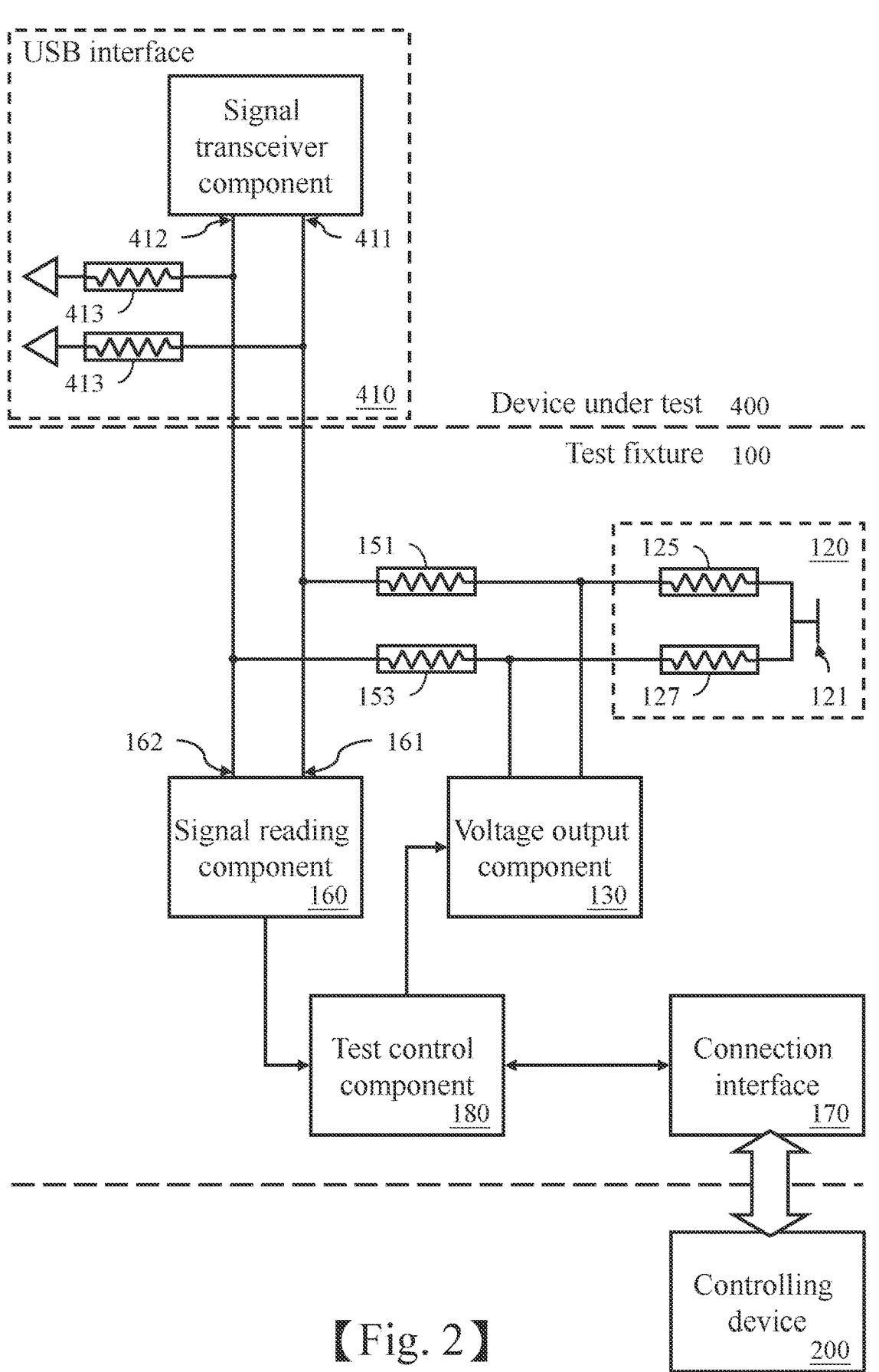
【Fig. 2】

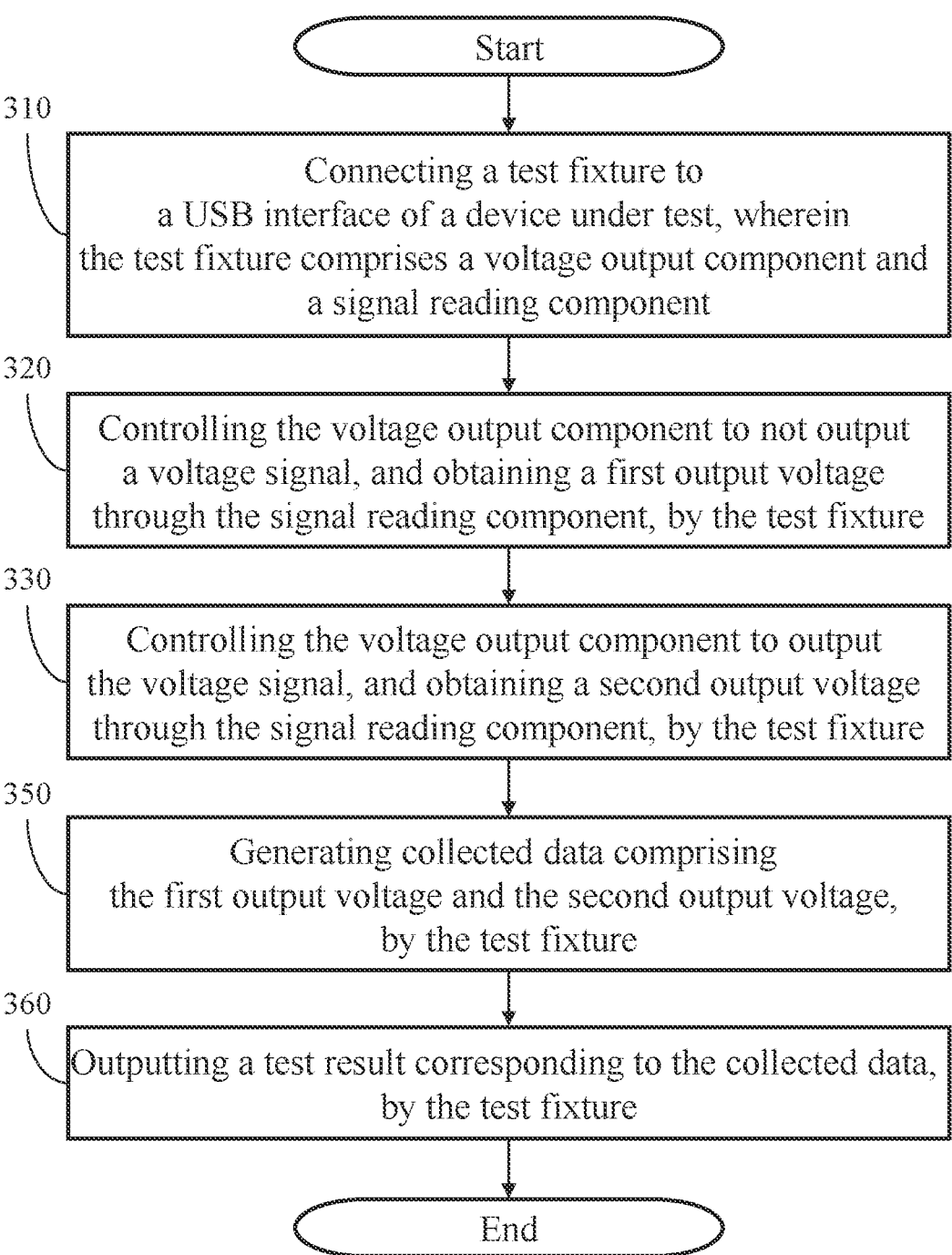

310 — Connecting a test fixture to a USB interface of a device under test, wherein the test fixture comprises a voltage output component and a signal reading component 320 — Controlling the voltage output component to not output a voltage signal, and obtaining a first output voltage through the signal reading component, by the test fixture 330 — Controlling the voltage output component to output the voltage signal, and obtaining a second output voltage through the signal reading component, by the test fixture 350 — Generating collected data comprising the first output voltage and the second output voltage, by the test fixture 360 — Outputting a test result corresponding to the collected data, by the test fixture 【Fig. 3】

SYSTEM, DEVICE AND METHOD FOR DETERMINING TEST RESULT BASED ON OUTPUT VOLTAGES OF USB INTERFACE

BACKGROUND OF THE INVENTION

1. Field of the Invention

The present invention is related to a USB interface test system, a device, and a method thereof, and more particular to a system, a device, and a method for determining test result based on output voltages of USB interface.

2. Description of the Related Art

Industry 4.0 (also known as the fourth industrial revolution) is not just creation of new industrial technologies, but focuses on the integration of existing industrial technologies, sales processes and product experience, so as to build a smart factory with adaptability, resource efficiency and ergonomics through artificial intelligence (AI) technology, and integrate customers and business partners in the business process and value process to provide perfect after-sales service, thereby establishing a new intelligent industrial world with perception consciousness.

With the wave of the Industry 4.0 sweeping the world, manufacturers are all using smart manufacturing to optimize production transformation and enhance competitiveness. The smart manufacturing is to realize the intelligent product design, manufacturing, and enterprise management and service based on sensing technology, network technology, automation technology and AI through the processes of perception, human-computer interaction, decision-making, execution and feedback.

The electronic assembly industry has characteristics of small profits but quick turnover and fierce product price competition, so the manufacturers in the electronic assembly industry always pursue more effective control and optimization of raw materials and production tools, thereby maximizing the efficiency of factory production resources.

In an existing production process for computing apparatus (such as servers, desktop computers), there are two testing methods for the universal serial bus (USB) 2.0 interface, which is represented as a USB interface in the present invention. The first testing method uses a boundary scan, and the second testing method uses functional testing manner.

Without entering the operating system, the first testing method can directly use boundary scan to directly push test data to the pins of the USB interface to be tested, and then determine whether the connection of the USB interface works normally based on the consistency of data transmission and reception.

In practice, the first testing method is only applicable to test the devices that support IEEE 1149.1 or 1149.6. The devices that do not support the first testing method only can use the second testing method, in which the testing is performed through handshake or data push functions. In more details, the second testing method usually needs to execute computer software in the operating system, and the executed software calls an application programming interface (API) to send and receive handshake signals and data through a USB interface of the device under test, so as to check the functionality of the USB interface.

However, the second testing method using the above-mentioned functional testing needs to start the operating system of the device under test to complete the testing of USB interface. Therefore, there is a waiting time for booting during testing process, and it causes low test efficiency.

According to above-mentioned contents, what is needed is to develop an improved solution to solve the problem that a computing apparatus not supporting boundary scanning function needs to start the operating system for testing a USB interface.

SUMMARY OF THE INVENTION

An objective of the present invention is to disclose a system, a device, and a method for determining test result based on output voltages of USB interface, to solve the problem that a computing apparatus not supporting boundary scanning function needs to start the operating system for testing a USB interface.

In order to achieve the objective, the present invention discloses a system for determining test result based on output voltages of USB interface, and the system includes a controlling device and a test fixture connected to the controlling device, the test fixture includes a connection interface connected to the controlling device; a pull-up circuit including a first pull-up component and a second pull-up component; a voltage output component connected to the first pull-up component and the second pull-up component; a third pull-up component connected to the first pull-up component, the voltage output component, and the USB interface; a fourth pull-up component connected to the second pull-up component, the voltage output component, and the USB interface; a signal reading component connected to the third pull-up component, the fourth pull-up component, and the USB interface; a test control component connected to the voltage output component, the signal reading component, and the connection interface. The test control component is configured to receive a test signal transmitted from the controlling device through the connection interface, control the voltage output component to output a voltage signal or not output the voltage signal, based on the test signal, and obtain an output voltage of the USB interface read by the signal reading component under conditions that the voltage output component outputs the voltage signal and does not output the voltage signal respectively, to generate collected data, and transmit the collected data to the controlling device through the connection interface, to make the controlling device generate a test result of the device under test based on the collected data.

In order to achieve the objective, the present invention discloses a device for determining test result based on output voltages of USB interface, and the device at least includes a pull-up circuit including a first pull-up component and a second pull-up component; a voltage output component connected to the first pull-up component and the second pull-up component; a third pull-up component connected to the first pull-up component, the voltage output component, and the USB interface; a fourth pull-up component connected to the second pull-up component, the voltage output component, and the USB interface; a signal reading component connected to the third pull-up component, the fourth pull-up component, and the USB interface; a test control component connected to the voltage output component and the signal reading component. The test control component is configured to control whether the voltage output component outputs a voltage signal or not, and obtain output voltages of the USB interface read by the signal reading component under the conditions of the voltage output component outputting the voltage signal and not outputting the voltage signal, to generate a collected data, and generate a test result based on the collected data.

In order to achieve the objective, the present invention discloses a method for determining test result based on output voltages of USB interface, include steps of: connecting a test fixture to a USB interface of the device under test, wherein the test fixture comprises a first pull-up component, a second pull-up component, a voltage output component, a third pull-up component, a fourth pull-up component, a signal reading component, and a test control component, the test control component is connected to the voltage output component and the signal reading component, the voltage output component is connected to the first pull-up component, the second pull-up component, the third pull-up component, and the fourth pull-up component, the signal reading component is connected the device under test, the third pull-up component, and the fourth pull-up component, the first pull-up component is connected to the third pull-up component, the second pull-up component is connected to the fourth pull-up component, the third pull-up component is connected to the fourth pull-up component and the device under test; controlling the voltage output component to not output a voltage signal, and obtaining a first output voltage through the signal reading component, by the test fixture, wherein the first output voltage is an output voltage of the USB interface under a condition of the voltage output component not outputting the voltage signal; controlling the voltage output component to output the voltage signal, and obtaining a second output voltage through the signal reading component, by the test fixture, wherein the second output voltage is the output voltage of the USB interface under a condition of the voltage output component outputting the voltage signal; generating collected data comprising the first output voltage and the second output voltage, and outputting a test result corresponding to the collected data, by the test fixture.

According to the above-mentioned system, the device, and the method of the present invention, the difference between the present invention and the conventional technology is that, in the present invention, the USB specification-compliant pull-up component is disposed in the test fixture, the test fixture is controlled whether to output the voltage signal to the USB interface of the device under test, or control the test fixture to not output voltage signal, and then the output voltage corresponding to the USB interface is read, and the test result is generated based on the read output voltage, so that the conventional problem can be solved, and the effect of increasing testing efficiency can be achieved.

BRIEF DESCRIPTION OF THE DRAWINGS

The structure, operating principle and effects of the present invention will be described in detail by way of various embodiments which are illustrated in the accompanying drawings.

FIG. 1 is a structural view of a system for determining test result based on output voltages of USB interface, according to the present invention.

FIG. 2 is a structural view of a system for determining test result based on output voltages of USB interface, according to the present invention.

FIG. 3 is a flowchart of a method for determining test result based on output voltages of USB interface, according to the present invention.

DETAILED DESCRIPTION OF THE PREFERRED EMBODIMENTS

The following embodiments of the present invention are herein described in detail with reference to the accompanying drawings. These drawings show specific examples of the embodiments of the present invention. These embodiments are provided so that this disclosure will be thorough and complete, and will fully convey the scope of the invention to those skilled in the art. It is to be acknowledged that these embodiments are exemplary implementations and are not to be construed as limiting the scope of the present invention in any way. Further modifications to the disclosed embodiments, as well as other embodiments, are also included within the scope of the appended claims.

These embodiments are provided so that this disclosure is thorough and complete, and fully conveys the inventive concept to those skilled in the art. Regarding the drawings, the relative proportions and ratios of elements in the drawings may be exaggerated or diminished in size for the sake of clarity and convenience. Such arbitrary proportions are only illustrative and not limiting in any way. The same reference numbers are used in the drawings and description to refer to the same or like parts. As used herein, the singular forms "a", "an" and "the" are intended to include the plural forms as well, unless the context clearly indicates otherwise.

It is to be acknowledged that, although the terms 'first', 'second', 'third', and so on, may be used herein to describe various elements, these elements should not be limited by these terms. These terms are used only for the purpose of distinguishing one component from another component. Thus, a first element discussed herein could be termed a second element without altering the description of the present disclosure. As used herein, the term "or" includes any and all combinations of one or more of the associated listed items.

It will be acknowledged that when an element or layer is referred to as being "on," "connected to" or "coupled to" another element or layer, it can be directly on, connected or coupled to the other element or layer, or intervening elements or layers may be present. In contrast, when an element is referred to as being "directly on," "directly connected to" or "directly coupled to" another element or layer, there are no intervening elements or layers present.

In addition, unless explicitly described to the contrary, the words "comprise" and "include", and variations such as "comprises", "comprising", "includes", or "including", will be acknowledged to imply the inclusion of stated elements but not the exclusion of any other elements.

The present invention uses a test fixture to complete test for a USB interface of the device under test (DUT) while the DUT is not required to enter the operating system for performing function test. In general, when the test fixture tests the USB interface of the device under test, the test fixture is usually connected to the controlling device, and tests the USB interface of the device under test based on a test signal generated by the controlling device; however, the present invention is not limited to above-mentioned examples, and in an embodiment, the test fixture independently complete the test for the USB interface of the device under test. The controlling device of the present invention is usually a computing apparatus.

The device mentioned in the present invention can be implemented by a computing apparatus. The computing apparatus mentioned in the present invention can include, but not limited to, one or more processing module, one or more memory module, and a bus connected to different hardware components including the memory module and the processing module. Through the multiple hardware components, the computing apparatus can load and execute the operating system, so that the operating system runs on the computing apparatus and executes software or programs. In addition, the computing apparatus can include an outer shell, and the above-mentioned hardware components are disposed in the outer shell.

The bus mentioned in the present invention can include at least one type of bus, for example, the bus can include at least one of a data bus, an address bus, a control bus, an expansion bus, and a local bus. The bus of a computation device can include, but not limited to, a parallel bus such as an industry standard architecture (ISA) bus, a peripheral component interconnect (PCI) bus, a video electronics standards association (VESA) local bus, or a serial bus such as a USB, or a PCI express (PCI-E/PCIe) bus.

The processing module of the computing apparatus is coupled with the bus. The processing module includes a register group or a register space. The register group or the register space can be completely set on the processing chip of the processing module, or can be all or partially set outside the processing chip and is coupled to the processing chip through dedicated electrical connection and/or a bus. The processing module can be a central processing unit, a microprocessor, or any suitable processing component. If the computing apparatus is a multi-processor apparatus, that is, the computing apparatus includes processing modules, and the processing modules can be all the same or similar, and coupled and communicated with each other through a bus. The processing module can interpret a computer instruction or a series of multiple computer instructions to perform specific operations or operations, such as mathematical operations, logical operations, data comparison, data copy/moving, so as to drive other hardware component, execute the operating system, or execute various programs and/or module in the computing apparatus. The computer instructions can include assembly language instructions, instruction set architecture instructions, machine instructions, machine-related instructions, microinstructions, firmware instructions, or source code or object code written in one or more programming languages. The instructions can be executed entirely on a single computing apparatus, partially on a single computing apparatus, or partially on one computing apparatus and partially on another interconnected computing apparatus. The above-mentioned programming language can be, for example, object-oriented languages such as Common Lisp, Python, C++, Objective-C, Smalltalk, Delphi, Java, Swift, C#, Perl, Ruby, as well as procedural languages like C or similar languages.

The computing apparatus usually also includes one or more chipsets. The processing module of the computing apparatus can be coupled to the chipset, or electrically connected to the chipset through the bus. The chipset includes one or more integrated circuits (IC) including a memory controller and a peripheral input/output (I/O) controller, that is, the memory controller and the peripheral input/output controller can be implemented by one integrated circuit, or implemented by two or more integrated circuits. Chipsets usually provide I/O and memory management functions, and multiple general-purpose and/or dedicated-purpose registers, timers. The above-mentioned general-purpose and/or dedicated-purpose registers and timers can be coupled to or electrically connected to one or more processing modules to the chipset for being accessed or used. In an embodiment, the chipset can be a part of the processing module.

The processing module of the computing apparatus can also access the data stored in the memory module and mass storage area installed on the computing apparatus through the memory controller. The above-mentioned memory modules include any type of volatile memory and/or non-volatile memory (NVRAM), such as Static Random Access Memory (SRAM), Dynamic Random Access Memory (DRAM), Read-Only Memory (ROM), or Flash memory. The above-mentioned mass storage area can include any type of storage device or storage medium, such as hard disk drives, optical discs, flash drives, memory cards, and solid state disks (SSD), or any other storage device. In other words, the memory controller can access data stored in static random access memory, dynamic random access memory, flash memory, hard disk drives, and solid state drives.

The processing module of the computing apparatus can also be in connection and communication with peripheral devices and interfaces including peripheral output devices, peripheral input devices, communication interfaces, or data/signal receivers through the peripheral I/O controller and the peripheral I/O bus. The peripheral input device can be any type of input device, such as a keyboard, mouse, trackball, touchpad, or joystick. The peripheral output device can be any type of output device, such as a display, or a printer; the peripheral input device and the peripheral output device can also be the same device such as a touch screen. The communication interface can include a wireless communication interface and/or a wired communication interface. The wireless communication interface can include the interface capable of supporting wireless local area networks (such as Wi-Fi, Zigbee, etc.), Bluetooth, infrared, and near-field communication (NFC), 3G/4G/5G and other mobile communication network (cellular network) or other wireless data transmission protocol; the wired communication interface can be an Ethernet device, a DSL modem, a cable modem, an asynchronous transfer mode (ATM) devices, or optical fiber communication interfaces and/or components. The data/signal receiver can include a GPS receiver or physiological signal receiver. The physiological signals received by the physiological signal receiver include, but are not limited to, heartbeat, blood oxygen levels, and so on. The processing module can periodically poll various peripheral devices and interfaces, so that the computing apparatus can input and output data through various peripheral devices and interfaces, and can also communicate with another computing apparatus having the above-mentioned hardware components.

Please refer to FIG. 1. FIG. 1 is a structural view of a system for determining test result based on an output voltage of a USB interface, according to the present invention. As shown in FIG. 1, the system is included in the test fixture 100, and the system includes a pull-up circuit 120, a voltage output component 130, a third pull-up component 151, a fourth pull-up component 153, a signal reading component 160, and a test control component 180. The test control component 180 is connected to the voltage output component 130 and the signal reading component 160, the voltage output component 130 is connected to the pull-up circuit 120, the third pull-up component 151, the fourth pull-up component 153, and the test control component 180. The signal reading component 160 is connected to the third pull-up component 151, the fourth pull-up component 153, and a device under test (DUT) 400. The pull-up circuit 120 is connected to the voltage output component 130, the third pull-up component 151, and the fourth pull-up component 153.

When the voltage output component 130 does not output a voltage signal, the voltage output component 130 can keep a voltage level of the pin of the voltage output component 130 outputting the voltage signal, to be stable. In an embodiment, the pull-up circuit 120 can include a first pull-up component 125, a second pull-up component 127; the pull-up circuit 120 can include an output power 121, optionally. The output power 121 is connected to the first pull-up component 125 and the second pull-up component 127, the first pull-up component 125 is connected to the voltage output component 130 and the third pull-up component 151, the second pull-up component 127 is connected to the voltage output component 130 and the fourth pull-up component 153.

For example, when the first pull-up component 125 and the second pull-up component 127 are passive components, the pull-up circuit 120 usually includes an output power 121, for example, when the first pull-up component 125 and the second pull-up component 127 are USB-specification-compliant resistors, the pull-up circuit 120 can include the output power 121 for outputting 3.3 volt; however, the present invention is not limited to above-mentioned examples. When the first pull-up component 125 and the second pull-up component 127 are active components, the pull-up circuit 120 does not include the output power 121, for example, the first pull-up component 125 and the second pull-up component 127 can be power output devices for outputting stable voltages. However, the pull-up circuit 120 of the present invention is not limited to above-mentioned example.

The voltage output component 130 receives a control signal transmitted from the test control component 180, and select whether to output a voltage signal through the pin connected to the pull-up circuit 120 and the third pull-up component 151 based on the received control signal. In general, the voltage output component 130 can be a power chip or a functional circuit having a voltage output ability.

in an embodiment, the third pull-up component 151 and the fourth pull-up component 153 are USB-specification-compliant resistors.

The signal reading component 160 is configured to read an output voltage of the USB interface 410 of the DUT 400. In general, the signal reading component 160 is usually an analog-to-digital converter (ADC) or a functional circuit or chip having analog-to-digital function; however, the present invention is not limited to above-mentioned examples.

In more details, when the voltage output component 130 does not output a voltage signal, the signal reading component 160 can read the output voltages of the first data transmission pin (D+) 411 and the second data transmission pin (D−) 412 of the USB interface 410 of the DUT 400 under conditions of the first data transmission pin (D+) 411 and the second data transmission pin (D−) 412 being in a normal status, an open-circuiting status, a mutual-short-circuit status, and a ground short circuit status, through the first signal receiving pin 161 and the second signal receiving pin 162 connected to the first data transmission pin (D+) 411 and the second data transmission pin (D−) 412 of the USB interface 410 of the DUT 400. When the voltage output component 130 outputs a voltage signal, the signal reading component 160 can read the output voltages of the first data transmission pin (D+) 411 and the second data transmission pin (D−) 412 of the USB interface 410 of the DUT 400 under conditions of the first data transmission pin (D+) 411 and the second data transmission pin (D−) 412 being in a normal status, an open-circuiting status, a mutual-short-circuit status, and a ground short circuit status.

The test control component 180 generates the control signal to control the voltage output component 130 to output voltage or not output the voltage signal. The signal reading component 160 can read the output voltage of the USB interface 410 of the DUT 400 when the test control component 180 controls the voltage output component 130 to output the voltage signal or not output the voltage signal, and the test control component 180 can generate the collected data including the output voltages obtained by the signal reading component 160. In general, the test control component 180 can be logic component such as complex programmable logic device (CPLD), or field programmable gate array (FPGA); however, the present invention is not limited to above-mentioned examples.

The test control component 180 generates a test result based on the generated collected data. In more details, the test control component 180 can generate a test result of the DUT 400 based on whether each of the voltage values of a first data transmission pin 411 and a second data transmission pin 412 of the USB interface 410 of the DUT 400 recorded in the collected data matches an expected voltage, wherein the voltage values are generated under one of conditions of the first data transmission pin 411 and the second data transmission pin 412 being in a normal status, an open-circuiting status, a mutual-short-circuit status, and a ground short circuit status when the voltage output component 130 outputs the voltage signal and dose not output the voltage signal.

In general, the test control component 180 can calculate the expected voltage of the voltage signal of the first data transmission pin (D+) 411 under the conditions that the first data transmission pin (D+) 411 is in the normal status and the voltage output component 130 does not output the voltage signal, based on a resistance value ($R_{pd}$) of the interface resistor 413 in the USB interface 410 of the DUT 400, a resistance value ($R_{pu1a}$) of the first pull-up component 125, a resistance value ($R_{pu2a}$) of the third pull-up component 151, and the input voltage ($V_{cc}$) provided by the pull-up circuit 120; the test control component 180 can calculate the expected voltage of the first data transmission pin (D+) 411 under the conditions that the first data transmission pin (D+) 411 is in the normal status and the voltage output component 130 outputs the voltage signal, based on the resistance value ($R_{pd}$) of the interface resistor 413, the resistance value ($R_{pu2a}$) of the third pull-up component 151, and the input voltage ($V_{cc}$) provided by the pull-up circuit 120; the test control component 180 can calculate the expected voltage of the second data transmission pin (D−) 412 under the conditions that the second data transmission pin (D−) 412 is in the normal status and the voltage output component 130 does not output voltage signal, based on the resistance value ($R_{pd}$) of the interface resistor 413, the resistance value ($R_{pu1b}$) of the second pull-up component 127, the resistance value ($R_{pu2b}$) of the fourth pull-up component 153, and the input voltage ($V_{cc}$) provided by the pull-up circuit 120; the test control component 180 can calculate the expected voltage of the second data transmission pin (D−) 412 under conditions that the second data transmission pin (D−) 412 is in the normal status and the voltage output component 130 outputs the voltage signal, based on the resistance value ($R_{pd}$) of the interface resistor 413, the resistance value ($R_{pu2}$) of the fourth pull-up component 153, and the input voltage ($V_{cc}$) provided by the pull-up circuit 120; the test control component 180 can calculate the expected voltage of the first data transmission pin (D+) 411 and the second data transmission pin (D−) 412 under the condition that the first data transmission pin (D+) 411 and the second data transmission pin (D−) 412 are in the mutual-short-circuit condition, and each of the conditions of the voltage output component 130 outputting the voltage signal and not outputting the voltage signal, based on the resistance value $(R_{pd})$ of the interface resistor 413, the resistance value $(R_{pula})$ of the first pull-up component 125, the resistance value $(R_{pulb})$ of the second pull-up component 127, the resistance value $(R_{pu2a})$ of the third pull-up component 151, the resistance value $(R_{pu2})$ of the fourth pull-up component 153, and the input voltage $(V_{cc})$ provided by the pull-up circuit 120. In addition, the test control component 180 can set the expected voltage of each of the first data transmission pin (D+) 411 and the second data transmission pin (D−) 412 under each of the conditions that the first data transmission pin (D+) 411 and the second data transmission pin (D−) 412 are in the open-circuit status and GND-short-circuit status, and each of the conditions of the voltage output component 130 outputting the voltage and not outputting the voltage signal.

For example, as shown in a table below, the test control component 180 can generate the expected voltage under various conditions:

|  | Measure status | Expected voltage |
|---|---|---|
| The voltage output component 130 does not output the voltage signal (high resistance), and the DUT 400 does not enter the function status | D+: normal | $V_{cc} * (R_{pd}/(R_{pula} + R_{pu2a} + R_{pd}))$ |
|  | D−: normal | $V_{cc} * (R_{pd}/(R_{pulb} + R_{pu2b} + R_{pd}))$ |
|  | D+: open-circuit | $V_{cc}$ |
|  | D−: open-circuit | $V_{cc}$ |
|  | D+ and D− are short-circuit | $V_{cc} * ((R_{pd}/2)/((((R_{pula} + R_{pu2a}) * (R_{pulb} + R_{pu2b}))/R_{pulb} + (R_{pu2b} + 2 * R_{pd})) + (R_{pd}/2)))$ |
|  | D+ and GND are short-circuit | 0 |
|  | D− and GND are short-circuit | 0 |
| The voltage output component 130 outputs a voltage signal, the DUT 400 fails to enter the functional status | D+ normal | $V_{cc} * (R_{pd}/(R_{pu2a} + R_{pd}))$ |
|  | D− normal | $V_{cc} * (R_{pd}/(R_{pu2b} + R_{pd}))$ |
|  | D+: open-circuit | $V_{cc}$ |
|  | D−: open-circuit | $V_{cc}$ |
|  | D+ and D−: short-circuit | $Vcc * ((R_{pd}/2)/(((R_{pu2a} * R_{pu2b})/(R_{pu2a} + R_{pu2b})) + (R_{pd}/2)))$ |
|  | D+ and GND: short-circuit | 0 |
|  | D− and GND: short-circuit | 0 |
| The voltage output component 130 outputs a voltage signal, the DUT 400 enters the function status | D+: normal | $V_{cc}$ |
|  | D−: normal | $V_{cc}$ |

In other words, the test control component 180 can calculate a first quotient generated by dividing resistance value $(R_{pd})$ of the interface resistor 413 of the USB interface 410 of the DUT 400 by a sum $(R_{pula}+R_{pu2a}+R_{pd})$ of resistance values of the interface resistor 413, the first pull-up component 125 and the third pull-up component 151, and then calculate a first product of the generated first quotient and the input voltage $(V_{cc})$ provided by the pull-up circuit 120, and set the first product as the expected voltage of the first data transmission pin (D+) 411 under the condition that the expected voltage of the first data transmission pin (D+) 411 is in the normal status and the voltage output component 130 does not output the voltage signal. The test control component 180 can set the expected voltage of the first data transmission pin (D+) 411 under the condition that the first data transmission pin (D+) 411 is in the open-circuit status and the voltage output component 130 does not output the voltage signal, to be input voltage $(V_{cc})$ provided by the pull-up circuit 120. The test control component 180 can set 0 as the expected voltage of the first data transmission pin (D+) 411 under the condition that the first data transmission pin (D+) 411 is in the GND-short-circuit (short-circuited to ground) status and the voltage output component 130 does not output the voltage signal. The test control component 180 can calculate a second quotient by dividing the resistance value $(R_{pd})$ of the interface resistor 413 by a sum $(R_{pulb}+R_{pu2b}+R_{pd})$ of the resistance values of the interface resistor 413, the second pull-up component 127 and the fourth pull-up component 153, and then calculate a second product of the second quotient and the input voltage $(V_{cc})$ provided by the pull-up circuit 120, and set the second product as the expected voltage of the second data transmission pin (D−) 412 under the condition that the second data transmission pin (D−) 412 is in the normal status and the voltage output component 130 does not output the voltage signal. The test control component 180 can set the expected voltage of the second data transmission pin (D−) 412 under the condition that the second data transmission pin (D−) 412 is in the open-circuit status and the voltage output component 130 does not output the voltage signal, to be input voltage $(V_{cc})$ provided by the pull-up circuit 120. The test control component 180 can set 0 as the expected voltage of the second data transmission pin (D−) 412 under the condition that the second data transmission pin (D−) 412 is in the GND-short-circuit status and the voltage output component 130 does not output the voltage signal. The test control component 180 can calculate a resistance value $(R_{pua})$ of an equivalent circuit of parallelly connection of a resistance value $(R_{pula}+R_{pu2a})$ of the serially-connected first pull-up component 125 and third pull-up component 151 and a resistance value $(R_{pulb}+R_{pu2b})$ of the serially-connected second pull-up component 127 and the fourth pull-up component 153 $(R_{pua}=(R_{pula}+R_{pu2a})*(R_{pulb}+R_{pu2b})/((R_{pula}+R_{pu2a})+(R_{pulb}+R_{pu2b}))$, and then calculate a third quotient by dividing a resistance value $(R_{pd}/2)$ of the parallelly-connected two interface resistors 413 by the resistance value $((R_{pd}/2)/(R_{pua}+ (R_{pd}/2)))$ of the parallel connection of the resistance value $(R_{pua})$ of an equivalent circuit and the resistance value $(R_{pd}/2)$ of the parallelly-connected two interface resistors, and calculate a third product of the third quotient and the input voltage $(V_{cc})$ provided by the pull-up circuit 120, and set the third product as the expected voltage of the first data transmission pin (D+) 411 and the second data transmission pin (D−) 412 under the condition that the first data transmission pin (D+) 411 and the second data transmission pin (D−) 412 are in mutual-short-circuit status and the voltage output component 130 does not output voltage signal. The test control component 180 calculates a fourth quotient by dividing the resistance value $(R_{pd})$ of the interface resistor 413 by a sum $(R_{pd}+R_{pu2a})$ of the resistance values of the interface resistor 413 and the third pull-up component 151, and then calculate a fourth product of the fourth quotient and the input voltage $(V_{cc})$ provided by the pull-up circuit 120, and use the fourth product as the expected voltage of the first data transmission pin (D+) 411 under the condition that the first data transmission pin (D+) 411 is in the normal status and the voltage output component 130 outputs the voltage signal. The test control component 180 can set the expected voltage of the first data transmission pin (D+) 411 under the condition that the first data transmission pin (D+) 411 is in the open-circuit status and the voltage output component 130 does not output the voltage signal, to be the input voltage ($V_{cc}$) provided by the pull-up circuit 120. The test control component 180 sets 0 as the expected voltage of the first data transmission pin (D+) 411 under the condition that the first data transmission pin (D+) 411 is in the GND-short-circuit status and the voltage output component 130 outputs the voltage signal. The test control component 180 can calculate a fifth quotient by dividing the resistance value ($R_{pd}$) of the interface resistor 413 by a sum ($R_{pd}+R_{pu2a}$) of the resistance values of the interface resistor 413 and the fourth pull-up component 153, and then calculate a fifth product of the fifth quotient and the input voltage ($V_{cc}$) provided by the pull-up circuit 120, and use the fifth product as the expected voltage of the second data transmission pin (D−) 412 under the condition that the second data transmission pin (D−) 412 is in the normal status and the voltage output component 130 outputs the voltage signal. The test control component 180 can set the expected voltage of the second data transmission pin (D−) 412 under the condition that the second data transmission pin (D−) 412 is in the open-circuit status and the voltage output component 130 outputs the voltage signal, to be the input voltage ($V_{cc}$) provided by the pull-up circuit 120. The test control component 180 can set 0 as the expected voltage of the second data transmission pin (D−) 412 under the condition that the second data transmission pin (D−) 412 is in the GND-short-circuit condition and the voltage output component 130 outputs voltage signal. The test control component 180 can calculate a resistance value ($R_{pub}$) of the equivalent circuit of the parallelly-connected third pull-up component 151 and fourth pull-up component 153 ($R_{pub}=$ ($R_{pu2a}*R_{pu2b}$)/($R_{pu2a}+R_{pu2b}$)), and then calculates a sum ($R_{pub}+R_{pd}/2$) of the calculated resistance value ($R_{pub}$) of the equivalent circuit and the resistance value ($R_{pd}/2$) of the parallelly connected interface resistors 413, and calculate a sixth quotient by dividing the resistance value ($R_{pd}/2$) of parallelly connected interface resistors 413 by the calculated sum ($R_{pub}+R_{pd}/2$), and calculate a sixth product of the sixth quotient and the input voltage ($V_{cc}$) provided by the pull-up circuit 120, and set the sixth product as the expected voltage of the first data transmission pin (D+) 411 and the second data transmission pin (D−) 412 under the condition that the first data transmission pin (D+) 411 and the second data transmission pin (D−) 412 are in the mutual-short-circuit status and the voltage output component 130 outputs voltage signal. The test control component 180 can set the expected voltage of the first data transmission pin (D+) 411 and the second data transmission pin (D−) 412 under the condition that the first data transmission pin (D+) 411 and the second data transmission pin (D−) 412 are in the normal status and the voltage output component 130 outputs the voltage signal.

Please refer to FIG. 2. FIG. 2 is a structural view of a system for determining test result based on output voltages of USB interface, according to the present invention. As shown in FIG. 2, the system is included in a test fixture 101, and the system includes a pull-up circuit 120, a voltage output component 130, a third pull-up component 151, a fourth pull-up component 153, a signal reading component 160, a connection interface 170, and a test control component 180. The pull-up circuit 120, the voltage output component 130, the third pull-up component 151, the fourth pull-up component 153, and the signal reading component 160 are the same as that of FIG. 1, so the detailed descriptions are not repeated herein.

The connection interface 170 is connected to the test control component 180, and the controlling device 200. The connection interface 170 can receive a test signal transmitted from the controlling device 200, and transmit the test result generated by the test control component 180 to the controlling device 200. In general, the connection interface 170 is an interface supporting Joint Test Action Group (JTAG); however, the present invention is not limited to above-mentioned examples, for example, the connection interface 170 can be a serial peripheral interface, (SPI) interface, or an inter-integrated circuit, (I2C) interface. In an embodiment, the controlling device 200 can be a computer, an industrial control host, or a test host; however, the present invention is not limited to above-mentioned examples.

The test control component 180 receives the test signal received by the controlling device 200, through the connection interface 170, and generates a control signal based on the received test signal, to control whether the voltage output component 130 outputs a voltage signal or nor.

When controlling the voltage output component 130 to output the voltage signal or not output the voltage signal, the test control component 180 can obtain the output voltage of the USB interface 410 of the DUT 400 through the signal reading component 160, and generate the collected data including the output voltages obtained by the signal reading component 160.

The test control component 180 can generate the test result having the generated collected data, and transmit the generated test result to the controlling device 200, through the connection interface 170, so that the controlling device 200 can perform determination the same as that of the test control component 180 of FIG. 1, based on the collected data in the received test result, that is, the controlling device 200 can generate the test result of the DUT 400 based on whether each of the output voltages of the first data transmission pin 411 and the second data transmission pin 412 of the USB interface 410 of the DUT 400 under one of the conditions of the first data transmission pin 411 and the second data transmission pin 412 being in a normal status, an open-circuiting status, a mutual-short-circuit status, and a ground short circuit status when the voltage output component 130 outputs the voltage signal and does not output the voltage signal, match the expected voltage.

The operation system and method of the present invention will be illustrated in the following paragraphs with reference to an embodiment. Please refer to FIG. 3. FIG. 3 is a flowchart of a method for determining test result based on output voltages of USB interface, according to the present invention.

In a step 310, a test personnel or an automatic testing equipment (not shown in drawing) connects test fixture 100 to a DUT 400 through the USB interface 410 of the DUT 400.

In a step 320, after the test fixture 100 is connected to the DUT 400, the test control component 180 of the test fixture 100 can control the voltage output component 130 of the test fixture 100 to not output the voltage signal, and the test control component 180 obtains the first output voltage of the USB interface 410 of the DUT 400, through the signal reading component 160 of the test fixture 100. In this embodiment, when the test fixture 100 has the same configuration as that shown in FIG. 1, after the test control component 180 determines that the test fixture 100 is connected to the DUT 400, the test control component 180 can generate a control signal based on a predetermined test program, and transmit the generated control signal to the voltage output component 130, to make the voltage output component 130 not output the voltage signal, and the signal reading component 160 can read the first output voltage of the USB interface 410 of the DUT 400 obtained by the signal reading component 160. When the test fixture 100 has the same configuration as that shown in FIG. 2, after the connection interface 170 receives the test signal generated by the controlling device 200, the test control component 180 can generate the control signal based on the received test signal, and transmit the generated control signal to the voltage output component 130, to make the voltage output component 130 not output voltage signal, and the test control component 180 can read the first output voltage of the USB interface 410 of the DUT 400 obtained by the signal reading component 160. The first output voltage obtained by the signal reading component 160 includes the output voltages of the second data transmission pin 412 and the first data transmission pin 411 of the USB interface 410 under the condition of the second data transmission pin 412 and the first data transmission pin 411 being in a normal status, an open-circuiting status, a mutual-short-circuit status, and a ground short circuit status.

In a step 330, after the test fixture 100 is connected to the DUT 400, the test control component 180 of the test fixture 100 controls the voltage output component 130 of the test fixture 100 to output voltage signal, and the test control component 180 obtains the second output voltage of the USB interface 410 of the DUT 400 through the signal reading component 160 of the test fixture 100. When the test fixture 100 has the same configuration as that shown in FIG. 1, after the test control component 180 determines that the test fixture 100 is connected to the DUT 400, the test control component 180 can generate a control signal based on a predetermined test program, and transmit the generated control signal to the voltage output component 130, to make the voltage output component 130 output the voltage signal, and the signal reading component 160 can read the second output voltage of the USB interface 410 of the DUT 400 obtained by the signal reading component 160. When the test fixture 100 has the same configuration as that shown in FIG. 2, after the connection interface 170 receives the test signal generated by the controlling device 200, the test control component 180 can generate the control signal based on the received test signal, transmit the generated control signal to the voltage output component 130, to make the voltage output component 130 output the voltage signal, and the test control component 180 can read the second output voltage of the USB interface 410 of the DUT 400 obtained by the signal reading component 160. The second output voltage obtained by the signal reading component 160 includes the output voltages of the second data transmission pin 412 and the first data transmission pin 411 of the USB interface 410 under the conditions of the second data transmission pin 412 and the first data transmission pin 411 being in a normal status, an open-circuiting status, a mutual-short-circuit status, and a ground short circuit status.

It is to be noted that, in the present invention, the test control component 180 of the test fixture 100 controls the voltage output component 130 of the test fixture 100 to not output the voltage signal and obtains the first output voltage through the signal reading component 160 of the test fixture 100 in the step 320, and the test control component 180 controls the voltage output component 130 to output voltage signal and obtain the second output voltage through the signal reading component 160 in the step 330, but there is no an order relationship between the step 320 and the step 330; in other words, the test control component 180 can control the voltage output component 130 to output the voltage signal and obtain the second output voltage through the signal reading component 160 in a step 330, and then control the voltage output component 130 to not output voltage signal and obtain the first output voltage through the signal reading component 160 in a step 320.

In a step 350, after the test control component 180 of the test fixture 100 controls the voltage output component 130 of the test fixture 100 to not output the voltage signal and obtain the first output voltage through the signal reading component 160 of the test fixture 100 (step 320), and control the voltage output component 130 to output the voltage signal and obtain the second output voltage through the signal reading component 160 (step 330), the test control component 180 generates the collected data based on the obtained first output voltage and the obtained second output voltage, and in a step 360, the test control component 180 outputs the test result corresponding to the generated collected data. In this embodiment, when the test fixture 100 has the same configuration as that shown in FIG. 1, the test control component 180 can read, or calculate, or set the expected voltage of the first data transmission pin 411 and the second data transmission pin 412 based on the output voltages of the first data transmission pin 411 and the second data transmission pin 412 of the USB interface 410 of the DUT 400 under the conditions of the first data transmission pin 411 and the second data transmission pin 412 being in a normal status, an open-circuiting status, a mutual-short-circuit status, and a ground short circuit status when voltage output component 130 outputs the voltage signal and does not output the voltage signal. The test control component 180 can generate the test result based on whether each of the output voltages of the first data transmission pin 411 and the second data transmission pin 412 of USB interface 410 recorded in the generated collected data under the one of conditions of the first data transmission pin 411 and the second data transmission pin 412 being in the normal status, the open-circuiting status, the mutual-short-circuit status, and the ground-short-circuit status when the voltage output component 130 outputs the voltage signal and does not output the voltage signal, matches the expected voltage, and the test control component 180 outputs the test result. When the test fixture 100 has the same configuration as that shown in FIG. 2, the test control component 180 generates the test result having the generated collected data, and transmits the generated test result to the controlling device 200 through the connection interface 170; after the controlling device 200 receives the test result transmitted from the test fixture 100, the controlling device 200 can read, or calculate, or set the expected voltages of the first data transmission pin 411 and the second data transmission pin 412 of the USB interface 410 of the DUT 400 under the conditions of the first data transmission pin and the second data transmission pin being in the normal status, the open-circuiting status, the mutual-short-circuit status, and the ground short circuit status when the voltage output component outputs the voltage signal and does not output the voltage signal, and the controlling device 200 can generate the test result of the DUT 400 based on whether each of the output voltages of the first data transmission pin 411 and the second data transmission pin 412 of the USB interface 410 recorded in the collected data of the received test data under the conditions of the first data transmission pin and the second data transmission pin being in the normal status, the open-circuiting status, the mutual-short-circuit status, and the ground short circuit status when the voltage output component outputs the voltage signal and does not output the voltage signal, matched the expected voltage.

As a result, the above-mentioned solution of the present invention is able to test the USB interface of the device under test without activating the operating system of the device under test, so as to shorten the testing time.

According to above-mentioned contents, the difference between the present invention and the conventional technology is that the USB specification-compliant pull-up component is disposed in the test fixture, the test fixture is controlled whether to output the voltage signal to the USB interface of the device under test, or control the test fixture to not output voltage signal, and then the output voltage corresponding to the USB interface is read, and the test result is generated based on the read output voltage, so that the conventional problem that a computing apparatus not supporting boundary scanning function needs to start the operating system for testing a USB interface can be solved, and the effect of increasing testing efficiency can be achieved.

Furthermore, the above-mentioned method for determining test result based on output voltages of USB interface can be implemented by hardware, software, or a combination thereof, and can be implemented in a computer system by a centralization manner, or by a distribution manner of different components distributed in several interconnect computer systems.

The present invention disclosed herein has been described by means of specific embodiments. However, numerous modifications, variations and enhancements can be made thereto by those skilled in the art without departing from the spirit and scope of the disclosure set forth in the claims.

What is claimed is:

1. A system for determining test result based on output voltages of USB interface, applied to test an USB interface of a device under test, and the system comprising:

a controlling device; and a test fixture, connected to the controlling device, and comprising:

a connection interface, connected to the controlling device;

a pull-up circuit, comprising a first pull-up component and a second pull-up component;

a voltage output component, connected to the first pull-up component and the second pull-up component;

a third pull-up component, connected to the first pull-up component, the voltage output component, and the USB interface;

a fourth pull-up component, connected to the second pull-up component, the voltage output component, and the USB interface;

a signal reading component, connected to the third pull-up component, the fourth pull-up component, and the USB interface; and a test control component, connected to the voltage output component, the signal reading component, and the connection interface, and configured to receive a test signal transmitted from the controlling device through the connection interface, control the voltage output component to output a voltage signal or not output the voltage signal, based on the test signal, and obtain output voltages of the USB interface read by the signal reading component under conditions that the voltage output component outputs the voltage signal and does not output the voltage signal respectively, to generate collected data, and transmit the collected data to the controlling device through the connection interface, to make the controlling device generate a test result of the device under test based on whether each of voltage values of a first data transmission pin and a second data transmission pin of the USB interface recorded in the collected data matches an expected voltage, wherein the voltage values are generated under one of conditions of the first data transmission pin and the second data transmission pin being in a normal status, an open-circuiting status, a mutual-short-circuit status, and a ground short circuit status when the voltage output component outputs the voltage signal and does not output the voltage signal;

wherein the test control component calculates the expected voltage of each of the first data transmission pin and the second data transmission pin under one of conditions of the first data transmission pin and the second data transmission pin being the normal status and the mutual-short-circuit status when the voltage output component does not output the voltage signal, based on an interface resistor of the USB interface, a resistance value of the first pull-up component, a resistance value of the second pull-up component, a resistance value of the third pull-up component, a resistance value of the fourth pull-up component and the input voltage, and set the expected voltages of the first data transmission pin and the second data transmission pin under one of the conditions of the first data transmission pin and the second data transmission pin being the open-circuit status and the ground-short-circuit status when the voltage output component does not output the voltage signal, to be the input voltage and 0, respectively, and set the expected voltages of the first data transmission pin and the second data transmission pin under the condition of the voltage output component outputting the voltage signal, to be a voltage value of the voltage signal.

2. The system for determining test result based on output voltages of USB interface according to claim 1, wherein each of the third pull-up component and the fourth pull-up component is a 15 ohms resistor, the input voltage is 3.3 V, and the voltage value of the voltage signal is 3.3 V.

3. A device for determining test result based on output voltages of USB interface, connected to the device under test, applied to test a USB interface on a device under test, and the device comprising:

a pull-up circuit, comprising a first pull-up component and a second pull-up component;

a voltage output component, connected to the first pull-up component and the second pull-up component;

a third pull-up component, connected to the first pull-up component, the voltage output component, and the USB interface;

a fourth pull-up component, connected to the second pull-up component, the voltage output component, and the USB interface;

a signal reading component, connected to the third pull-up component, the fourth pull-up component, and the USB interface; and a test control component, connected to the voltage output component and the signal reading component configured to control whether the voltage output component outputs a voltage signal or not, and obtain output voltages of the USB interface read by the signal reading component under the conditions of the voltage output component outputting the voltage signal and not outputting the voltage signal, to generate a collected data, and generate a test result based on whether each of voltage values of a first data transmission pin and a second data transmission pin of the USB interface recorded in the collected data matches an expected voltage, wherein the voltage values are generated under one of conditions of the first data transmission pin and the second data transmission pin being in a normal status, an open-circuiting status, a mutual-short-circuit status, and a ground short circuit status when the voltage output component outputs the voltage signal and does not output the voltage signal;

wherein the test control component calculates the expected voltage of each of the first data transmission pin and the second data transmission pin under one of conditions of the first data transmission pin and the second data transmission pin being the normal status and the mutual-short-circuit status when the voltage output component does not output the voltage signal, based on an interface resistor of the USB interface, a resistance value of the first pull-up component, a resistance value of the second pull-up component, a resistance value of the third pull-up component, a resistance value of the fourth pull-up component and the input voltage, and set the expected voltages of the first data transmission pin and the second data transmission pin under one of the conditions of the first data transmission pin and the second data transmission pin being the open-circuit status and the ground-short-circuit status when the voltage output component does not output the voltage signal, to be the input voltage and 0, respectively, and set the expected voltages of the first data transmission pin and the second data transmission pin under the condition of the voltage output component outputting the voltage signal, to be a voltage value of the voltage signal.

4. A method for determining test result based on output voltages of USB interface, comprising:

connecting a test fixture to a USB interface of a device under test, wherein the test fixture comprises a first pull-up component, a second pull-up component, a voltage output component, a third pull-up component, a fourth pull-up component, a signal reading component, and a test control component, the test control component is connected to the voltage output component and the signal reading component, the voltage output component is connected to the first pull-up component, the second pull-up component, the third pull-up component, and the fourth pull-up component, the signal reading component is connected the device under test, the third pull-up component, and the fourth pull-up component, the first pull-up component is connected to the third pull-up component, the second pull-up component is connected to the fourth pull-up component, the third pull-up component is connected to the fourth pull-up component and the device under test;

controlling the voltage output component to not output a voltage signal, and obtaining a first output voltage through the signal reading component, by the test fixture, wherein the first output voltage is an output voltage of the USB interface under a condition of the voltage output component not outputting the voltage signal;

controlling the voltage output component to output the voltage signal, and obtaining a second output voltage through the signal reading component, by the test fixture, wherein the second output voltage is the output voltage of the USB interface under a condition of the voltage output component outputting the voltage signal;

generating collected data comprising the first output voltage and the second output voltage, by the test fixture; and generating a test result of the device under test based on whether each of voltage values of a first data transmission pin and a second data transmission pin of the USB interface recorded in the collected data matches an expected voltage, and outputting test result corresponding to the collected data, by the test fixture, wherein the voltage values are generated under one of conditions of the first data transmission pin and the second data transmission pin being in a normal status, an open-circuiting status, a mutual-short-circuit status, and a ground short circuit status when the voltage output component outputs the voltage signal and does not output the voltage signal;

wherein the step of generating the test result of the device under test based on whether each of the voltage values of the first data transmission pin and the second data transmission pin of the USB interface recorded in the collected data matches the expected voltage by the test fixture, comprises calculating the expected voltage of each of the first data transmission pin and the second data transmission pin under one of the conditions of the first data transmission pin and the second data transmission pin being the normal status and the mutual-short-circuit status when the voltage output component does not output the voltage signal, based on an interface resistor of the USB interface, a resistance value of the first pull-up component or the second pull-up component, a resistance value of the third pull-up component or the fourth pull-up component and the input voltage, and setting the expected voltages of the first data transmission pin and the second data transmission pin under one of the conditions of the first data transmission pin and the second data transmission pin being the open-circuit status and the ground-short-circuit status when the voltage output component does not output the voltage signal, to be the input voltage and 0, respectively, and setting the expected voltages of the first data transmission pin and the second data transmission pin under the condition of the voltage output component outputting the voltage signal, to be a voltage value of the voltage signal, by the test fixture.

* * * * *